United States Patent [19]
Gata

[11] Patent Number: 5,355,036
[45] Date of Patent: Oct. 11, 1994

[54] TIMED MAKE-BEFORE-BREAK CIRCUIT FOR ANALOG SWITCH CONTROL

[75] Inventor: Daramana Gata, Dallas, Tex.

[73] Assignee: Texas Instruments Incorporated, Dallas, Tex.

[21] Appl. No.: 975,025

[22] Filed: Nov. 12, 1992

[51] Int. Cl.$^5$ .............................................. H03K 17/16
[52] U.S. Cl. ................... 307/542.1; 307/243; 307/445; 307/584
[58] Field of Search ..................... 307/542.1, 445, 243, 307/584–585, 491; 330/278–280

[56] References Cited

U.S. PATENT DOCUMENTS

| | | | |
|---|---|---|---|
| 4,057,738 | 11/1977 | Nishimura | 307/542.1 |
| 4,181,861 | 1/1980 | Maehashi | 307/542.1 X |
| 4,198,579 | 4/1980 | Ebihara et al. | 307/542.1 |
| 4,561,545 | 12/1985 | Carlow | 209/564 |
| 5,001,374 | 3/1991 | Chang | 307/542.1 |
| 5,032,739 | 7/1991 | Koh | 307/243 |
| 5,148,121 | 9/1992 | Uchida | 307/243 X |
| 5,196,733 | 3/1993 | Shin | 307/243 |

*Primary Examiner*—David R. Hudspeth
*Attorney, Agent, or Firm*—Alan K. Stewart; Richard L. Donaldson; William E. Hiller

[57] ABSTRACT

A timed make-before-break circuit for analog switch control is provided. The invention contains one or more delay circuit and more than one logic gate. Each logic gate has one logic gate input line connected to a delay circuit input line and another logic gate input line connected to a delay circuit output line. The logic gate input lines are connected to the delay circuit input line and the delay circuit output line from the same delay circuit. The invention also has more than one switch. Each switch has an input control line connected to a logic gate output line.

19 Claims, 5 Drawing Sheets

TIMED MAKE-BEFORE-BREAK CIRCUIT FOR ANALOG SWITCH CONTROL

FIELD OF THE INVENTION

This invention generally relates to electronic circuitry. More specifically, the invention relates to timed make-before-break circuits for analog switch control.

BACKGROUND OF THE INVENTION

Typical multi-state analog signal processing circuits have switching circuits. In an ideal closed loop circuit, one switch will be closed at the same time that another switch is opened. However, what typically happens with the switching is that one switch will open before the next switch closes. During a short period of time, all switches will be open causing an open loop system. This causes instability and spurious distortion due to undefined transient open loop circuit states.

An example is the undefined gain or attenuation setting in programmable gain circuits that use multiple switches in their signal paths to perform some kind of analog signal processing. These circuits are momentarily unstable and have unpredictably large transient spikes between the two circuit states or gain settings. There is a need for switching circuits that provide stability and have smaller transient spiking between circuit states compared to the typical switching case.

SUMMARY OF THE INVENTION

It has been discovered that instability and transient spiking due to typical switching for multi-state analog signal processing circuits has been a problem.

Generally, and in one form of the invention, a timed make-before-break circuit for analog switch control is provided. The invention contains one or more delay circuits and more than one logic gate. Each logic gate has one logic gate input line connected to a delay circuit input line and another logic gate input line connected to a delay circuit output line. The logic gate input lines are connected to the delay circuit input line and the delay circuit output line from the same delay circuit. The invention also has more than one switch. Each switch has an input control line connected to a logic gate output line.

An advantage of the invention is increased stability and smaller transient spiking between circuit states or gain changes in multi-state analog signal processing circuits compared to the typical switching case because the before and after circuit settings are already engaged when two or more of these circuits are used together.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
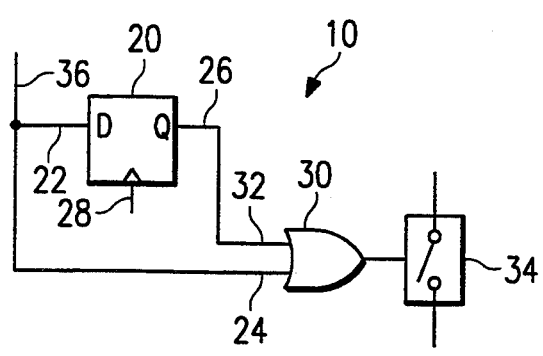
FIG. 1 is a diagram of an element of the make-before-break circuit of the invention.

Referring to FIG. 1, an element 10 of a make-before-break circuit is shown which employs a delay circuit 20, an "or" gate 30, and a switch 34. The delay circuit 20 can be any kind of latch or flip flop which provides an output equal to its input. The "or" gate 30 could be some other kind of logic gate such as an "and" gate depending on the desired output of the circuit. Current data is clocked into the delay circuit 20 through the current data line 22. The current data also goes directly to input line 24 of the "or" gate 30. The current data immediately turns the switch 34 on when the current state data is a logic one because the current data goes directly to the "or" gate 30. Once the current data is clocked into the delay circuit 20, the output line 26 from the delay circuit 20 provides the last state data. The last state data is equal to the current data that is input into the delay circuit 20 at the time of the last edge or level of the clock 28. The last state data then goes to input line 32 of the "or" gate 30. Then the two inputs to the "or" gate 30 will both be a logic one.

When new current data with a logic zero value is presented, the current state control line 36 shuts off. Then, the last state data on output line 26 maintains a logic one until the next edge or level of the clock 28. The switch 34 remains on as long as the last state data on output line 26 remains a logic one. After the next edge or level of the clock 28, the last state data on output line 26 then provides a logic zero. At that time, the switch 34 shuts off.

When more than one switch is involved, an orderly shutting down of the switches is achieved so that there is never an instance when all switches are off. This provides smaller transient spiking between circuit states or gain changes in multi-state analog signal processing circuits compared to an open loop switching case because the before and after circuit settings are already engaged when two or more of these circuits are used together.

Figure 2:
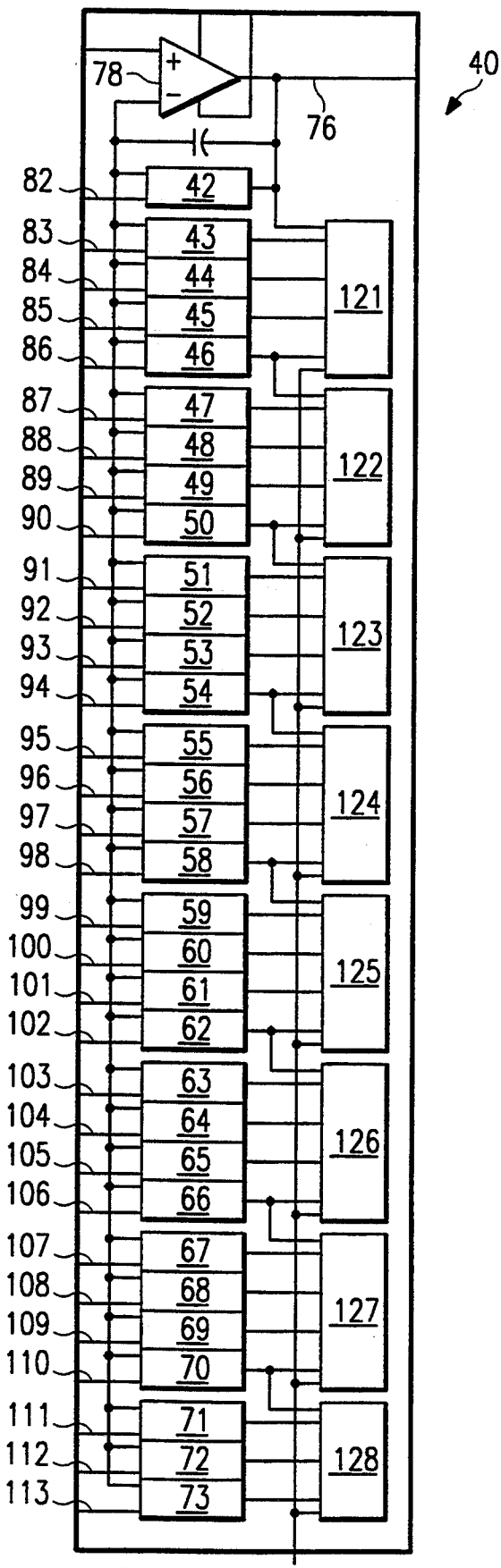
FIG. 2 is a diagram of a gain control circuit.

The gain control circuit 40, shown in FIG. 2, has thirty-two switches 42–73 and thirty-two control lines 82–113. Each one of the control lines 82–113 are connected to corresponding switch circuits 42–73. The switch circuits 42–73 are also connected to R-2R ladders in blocks 121–128. The R-2R ladders are resistor networks in the feedback path of the gain control circuit 40. The output of the gain control circuit 40 is controlled by the switches 42–73 which control the feedback to the amplifier 78. Control lines 82–113 are connected to the output control lines 142–173 of the make-before-break (MBB) control circuit 140, shown in FIGS. 3a and 3b.

Figure 3A:
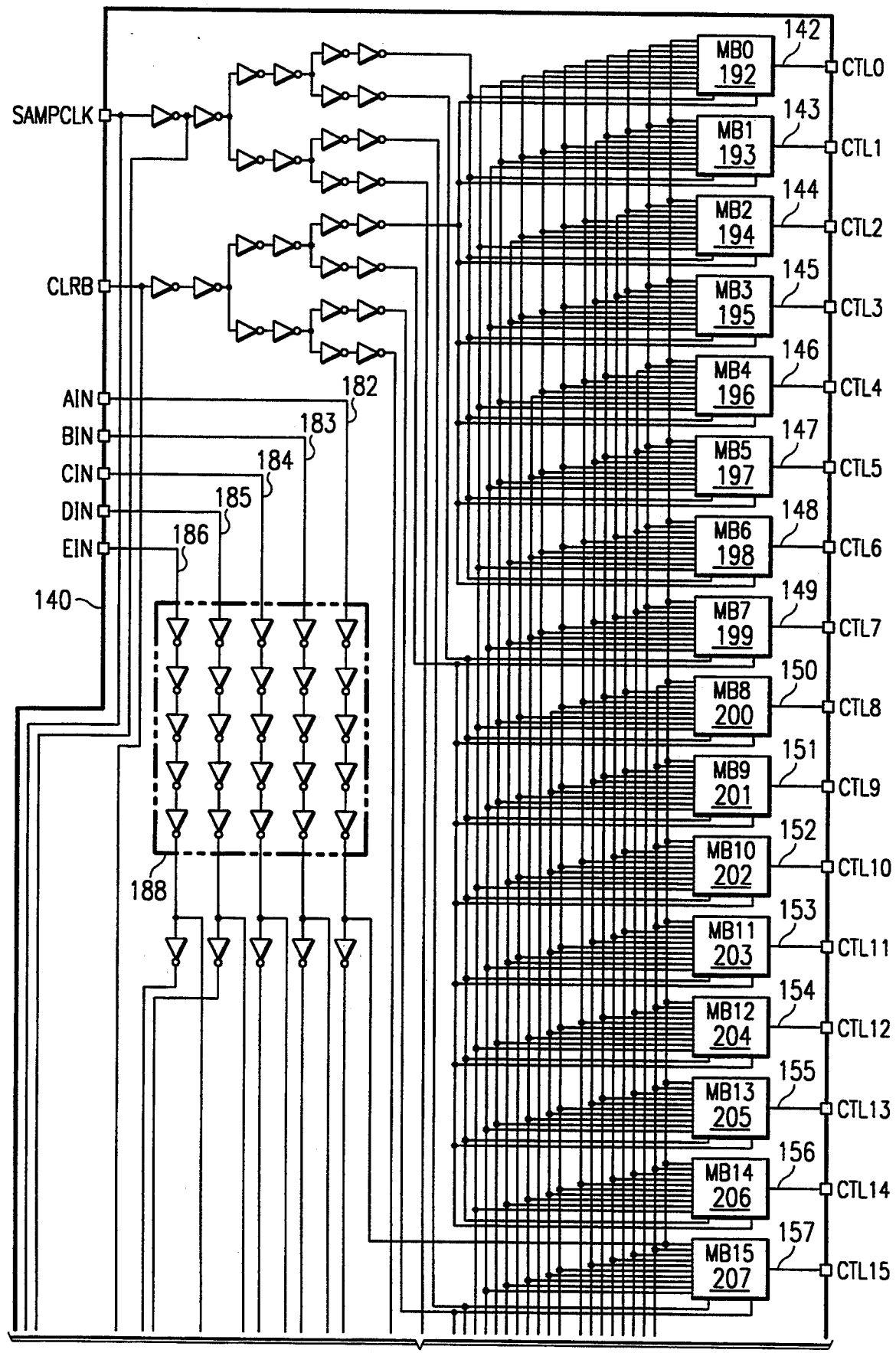
FIG. 3a and 3b are a diagram of a thirty-two state clocked synchronous make-before-break multiplexer and decoder circuit of the invention.
Figure 3B:
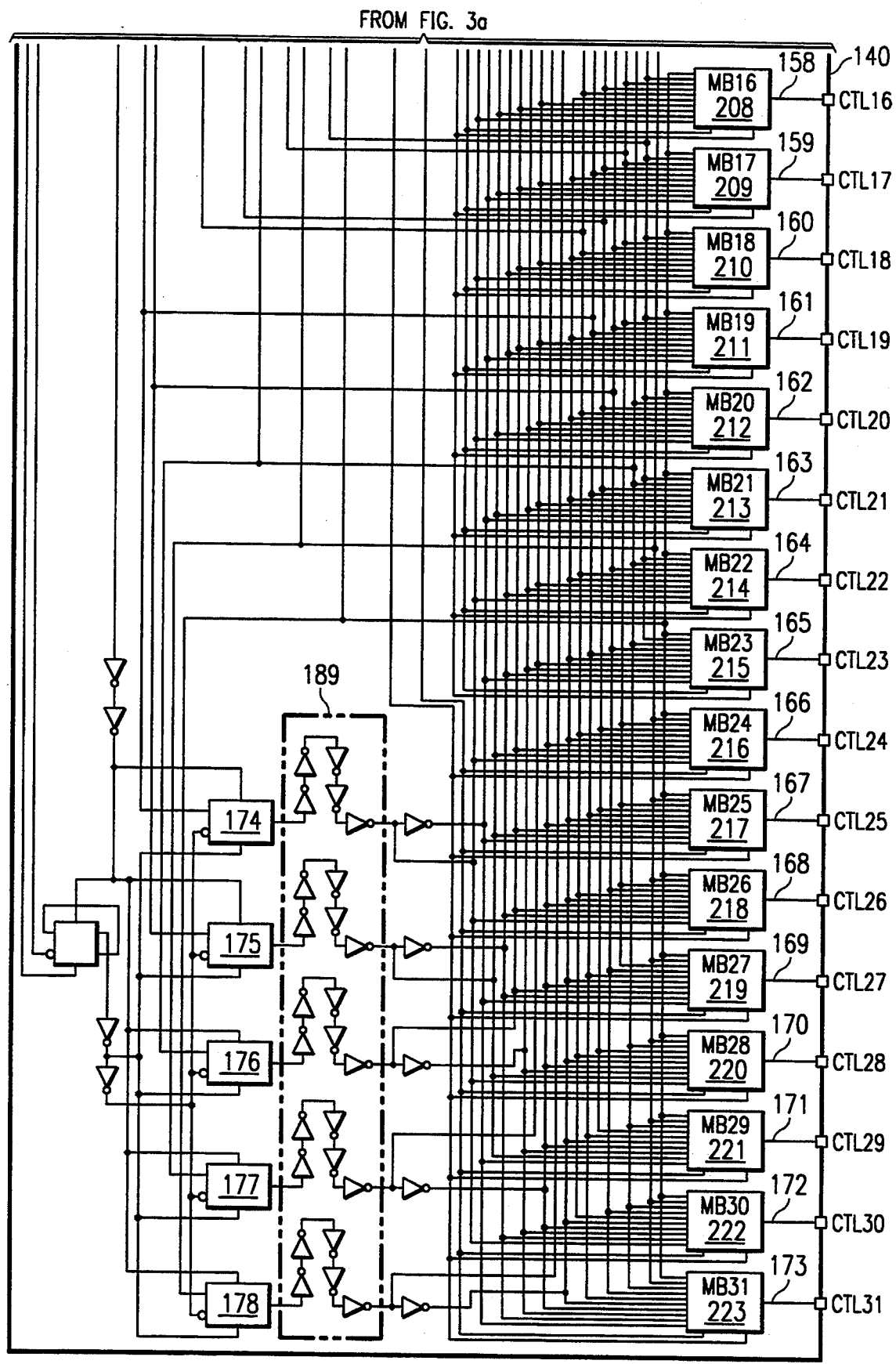
Figure 4:
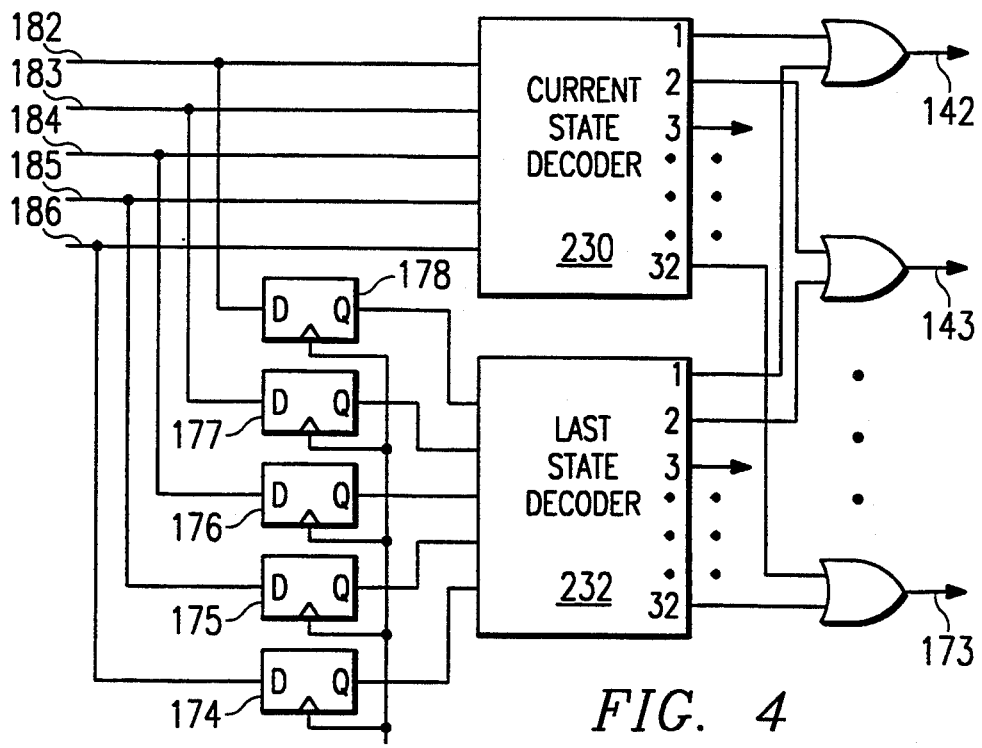
FIG. 4 is a simplified diagram of the circuit in FIGS. 3a and 3b.

The MBB control circuit 140, shown in FIGS. 3a and 3b, is a thirty-two state clocked synchronous make-before-break multiplexer and decoder. A simplified diagram of the MBB control circuit 140 is shown in FIG. 4. The decoders 230 and 232 each have five inputs and thirty-two outputs. For each input combination of the five inputs, only one of the output lines will provide a logic one.

The MBB control circuit 140 contains five current data input lines 182–186 and thirty-two output control lines 142–173. The MBB control circuit 140 also contains five delay circuits 174–178 which perform the same function as described above for the delay circuit 20, shown in FIG. 1. The MBB control circuit includes inverter trees such as current state inverter trees 188 and last state inverter trees 189. The circuit 250, shown in FIG. 5, is a detailed drawing of the circuits 192–223, shown in FIGS. 3a and 3b.

The data on each of the five current data input lines 182–186 or the inversion of that data are input into each of the circuits 192–223, shown in FIG. 3. The five current data input lines 182–186 are also connected to the five delay circuits 174–178. Current data input line 182 is connected to delay circuit 178. Current data input line 183 is connected to delay circuit 177. Current data input line 184 is connected to delay circuit 176. Current data input line 185 is connected to delay circuit 175. Current data input line 186 is connected to delay circuit 174. The output of the MBB control circuit 140 is controlled by the input from the delay circuits 174–178 and the input from the current state lines 182–186 as described for the single switch circuit of FIG. 1.

The MBB control circuit 140 operates in a way such that only one of the control lines 142–173 will be a logic one at any one time, except for the duration of a dock cycle while the delay circuits 174–178 are holding the last state data. During that short period of time, two of the control lines will provide a logic one. Then, after the next clock cycle, only one control line will provide a logic one. All of the remaining control lines will provide a logic zero. In this way, there is never a time when all of the switches 42–73 are shut off. Therefore, the output 76 of the gain control circuit 40, shown in FIG. 2, will be stable and will have smaller transient spiking between circuit states or gain changes compared to an open loop switching case.

Figure 5:
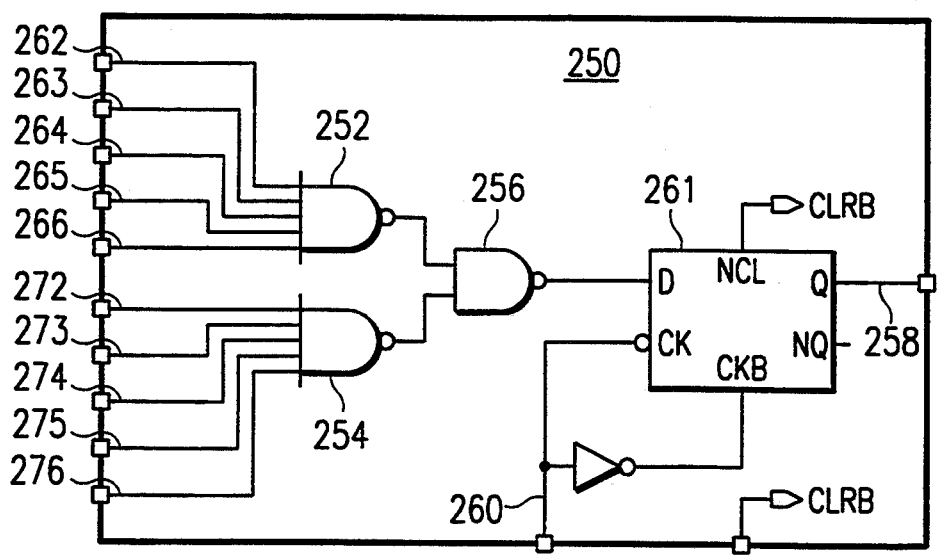
FIG. 5 is a diagram of a circuit within the circuit of FIGS. 3a and 3b.

The circuit 250 in FIG. 5 includes current state nand gate 252 and last state nand gate 254 with five inputs each, output nand gate 256 with two inputs, current state input lines 262–266, last state input lines 272–276, switch control output line 258, delay circuit 261, and dock input line 260. The switch control output line 258 corresponds with the output control lines 142–173, shown in FIGS. 3a and 3b. Output hand gate 256 takes the place of "or" gate 30 in FIG. 1.

Each of the inputs 262–266 to current state nand gate 252 of the circuit 250, shown in FIG. 5, are either the current state input from each of the five current data input lines 182–186 or the inverse of that current state input. For example, the input 262 to current state hand gate 252 is either the current state input from current state input line 182, shown in FIG. 3a, or the inverse of that signal. Each of the five input lines 272–276 to last state nand gate 254 provide either the output of one of the five delay circuits 174–178, shown in FIG. 3b, or the inverse of that output. For each current state input that is not inverted, the corresponding last state input is also not inverted. For each current state input that is inverted, the corresponding last state input is also inverted. For example, if input 262 of current state nand gate 252 is the inversion of the current state input line 182, then input 272 of last state hand gate 254 is the inversion of the last state output from delay circuit 178. This provides thirty-two different input combinations for the thirty-two circuits 192–223, shown in FIGS. 3a and 3b.

Figure 6:
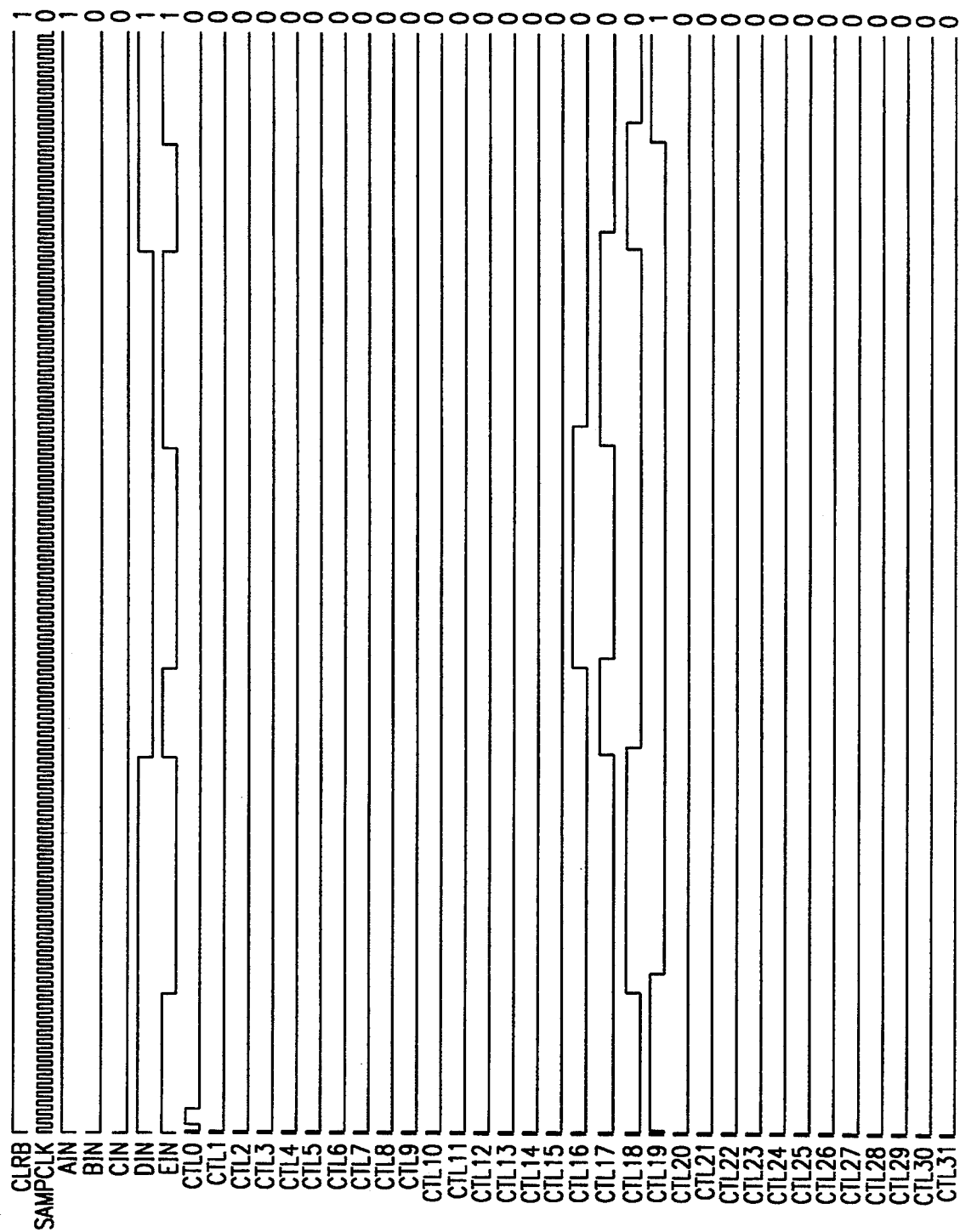
FIG. 6 is a waveform diagram of the input and output of the circuit in FIGS. 3a and 3b.

The MBB control circuit 140 provides for an orderly shutting down of the switches 42–73. When one switch goes on, there is also a second switch that remains on for one clock cycle before being shut off. This process is demonstrated in the waveform diagram shown in FIG. 6. This diagram shows the dock cycle (SAMPCLK), the five current data inputs (AIN, BIN, GIN, DIN, and EIN), and the thirty-two switch control signals (CTL0–CTL31). As seen in FIG. 6, when one of the switch control signals goes on, there is another switch control signal that remains on for a short period of time before shutting off.

This invention provides a gain control circuit output that has more stability and less spurious distortion due to undefined transient circuit states than conventional gain control circuits which do not have make-before-break switch control. These improved results are achieved because there is never an instance when all of the control switches are open.

A preferred embodiment has been described in detail hereinabove. It is to be understood that the scope of the invention also comprehends embodiments different from those described, yet within the scope of the claims.

For example, this make-before-break technique can be use in circuits other than gain control circuits such as for interpolation circuits, pixel edge detection circuits, and digital neural net circuits where switching of signal paths is done discretely.

Also, the timing of the analog switch control could be asynchronous as well as synchronous. The importance is that the control signal for a switch remain asserted for a designed finite time after the main control signal assertion has gone away.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
    at least one delay circuit;
    more than one logic gate, each logic gate having one logic gate input line connected to a delay circuit input line and another logic gate input line connected to a delay circuit output line, wherein the delay circuit input line and the delay circuit output line are from the same delay circuit; and
    more than one switch, each switch having an input control line connected to an output line of one of the logic gates.

2. The circuit of claim 1, wherein the logic gate is an "or" gate.

3. The circuit of claim 1, wherein the logic gate is a "nand" gate.

4. The circuit of claim 1, wherein no two switches have input lines connected to an output line of the same logic gate.

5. The circuit of claim 1, wherein the delay circuit has a clock input line.

6. The circuit of claim 5, wherein the delay circuit is a flip-flop.

7. The circuit of claim 1, wherein the switches are connected to a multistate analog signal processing circuit.

8. The circuit of claim 7, wherein the multi-state analog signal processing circuit is a gain control circuit.

9. A multi-state analog signal processing circuit comprising:
   a make-before-break decoder;
   switches connected to output lines from the decoder; and
   a multi-state analog circuit connected to the switches through a feedback network.

10. The circuit of claim 9, wherein the decoder is a multi-state clocked synchronous multiplexer and decoder.

11. The circuit of claim 10, wherein the decoder includes;
   current data input lines;
   delay circuits, input lines of the delay circuits connected to the current data input lines;
   current state inverters, inputs to the current state inverters connected to the current data input lines;
   last state inverters, inputs to the last state inverters connected to outputs from the delay circuits;
   current state logic gates, inputs to the current state logic gates connected to the current data input lines or connected to outputs from the current state inverters;
   last state logic gates, inputs to the last state logic gates connected to the outputs from the delay circuits or connected to outputs from the last state inverters; and
   output logic gates, inputs to the output logic gates connected to outputs from the current state logic gates and outputs from the last state logic gates.

12. The circuit of claim 11, wherein the current state logic gates are nand gates.

13. The circuit of claim 11, wherein the last state logic gates are nand gates.

14. The circuit of claim 13, wherein the output logic gates are nand gates.

15. The circuit of claim 14, wherein the multi-state analog circuit is a gain control circuit.

16. The circuit of claim 11, wherein each input to each current state logic gate is from a current data input line or from a current state inverter connected to the same current data input line.

17. The circuit of claim 16, wherein each input to each last state logic gate is from a delay circuit or from a last state inverter connected to the same delay circuit.

18. A method of controlling analog switches with a make-before-break circuit, which comprises:
   directing current data input signals into delay circuits;
   outputting last state signals from the delay circuits;
   directing the current data input signals and the last state signals to logic gates;
   outputting control signals from the logic gates; and
   inputting the control signals into switch circuits.

19. The method of claim 18 further comprising switching the feedback control lines of a multi-state analog circuit on and off.

* * * * *